(12) United States Patent
Kim et al.

(10) Patent No.: US 12,417,956 B2
(45) Date of Patent: Sep. 16, 2025

(54) DOUBLE-SIDE COOLING-TYPE SEMICONDUCTOR DEVICE

(71) Applicants: HYUNDAI MOTOR COMPANY, Seoul (KR); KIA CORPORATION, Seoul (KR)

(72) Inventors: Young Seok Kim, Seongnam-si (KR); Kyoung Kook Hong, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 458 days.

(21) Appl. No.: 17/889,097

(22) Filed: Aug. 16, 2022

(65) Prior Publication Data

US 2023/0119737 A1   Apr. 20, 2023

(30) Foreign Application Priority Data

Oct. 14, 2021   (KR) .......................... 10-2021-0136841

(51) Int. Cl.
*H01L 23/367*   (2006.01)
*H01L 23/00*    (2006.01)
*H01L 25/065*   (2023.01)

(52) U.S. Cl.
CPC .......... *H01L 23/3675* (2013.01); *H01L 24/26* (2013.01); *H01L 24/48* (2013.01); *H01L 24/73* (2013.01); *H01L 25/0657* (2013.01); *H01L 2224/2612* (2013.01); *H01L 2224/48091* (2013.01); *H01L 2224/73265* (2013.01)

(58) Field of Classification Search
CPC ....................................................... H01L 23/34
See application file for complete search history.

(56) References Cited

U.S. PATENT DOCUMENTS

| | | | |
|---|---|---|---|
| 9,922,911 B1 * | 3/2018 | Park | H01L 23/49562 |
| 10,276,522 B2 | 4/2019 | Wang et al. | |
| 2014/0353818 A1 | 12/2014 | Geitner et al. | |
| 2017/0365583 A1 | 12/2017 | Im et al. | |
| 2021/0296217 A1 * | 9/2021 | Tang | H01L 23/49575 |

FOREIGN PATENT DOCUMENTS

| | | |
|---|---|---|
| JP | 2004-096004 A | 3/2004 |
| JP | 4292686 B2 | 7/2009 |
| JP | 2014-022579 A | 2/2014 |
| JP | 2017-188635 A | 10/2017 |
| KR | 10-1380075 B1 | 4/2014 |

* cited by examiner

*Primary Examiner* — Yu-Hsi D Sun
(74) *Attorney, Agent, or Firm* — MCDONNELL BOEHNEN HULBERT & BERGHOFF LLP

(57) ABSTRACT

A double-side cooling-type semiconductor device includes a first circuit board and a second circuit board, a semiconductor element bonded to a control electrode of the first circuit board, a first spacer disposed between the first circuit board and the semiconductor element, bonded to the first circuit board, and bonded to the semiconductor element, and a second spacer disposed between the second circuit board and the semiconductor element, bonded to the second circuit board, and bonded to the semiconductor element.

15 Claims, 5 Drawing Sheets

[Heat stress analysis result
of novel structure power module (cross section)]

DOUBLE-SIDE COOLING-TYPE SEMICONDUCTOR DEVICE

CROSS REFERENCE TO RELATED APPLICATIONS

This application is based on and claims priority under 35 U.S.C. 119 to Korean Patent Application No. 10-2021-0136841, filed on Oct. 14, 2021, in the Korean Intellectual Property Office, the disclosure of which is herein incorporated by reference in its entirety.

BACKGROUND

Field

The present disclosure relates to a double-side cooling-type semiconductor device and, more specifically, to a double-side cooling-type semiconductor device including an additional material having a thermal expansion efficient similar to that of a material connected to a semiconductor element in order to reduce thermal stress concentered in the semiconductor element due to a spacer bonding structure for securing a height during wire bonding with an electrode, thereby ensuring that the semiconductor element can stably operate even at high temperatures.

Description of the Prior Art

Recently, electronic control of motors has been rapidly developed not only for improved fuel economy, but also for precise driving control. Therefore, power modules for electronic control of motors or power conversion devices using power modules are of increasing importance.

In this connection, a double-side cooling-type power module includes multiple semiconductor chips disposed between upper and lower substrates such that heat generated by the semiconductor chips is cooled by a cooler installed outside both substrates, and this structure can reduce the power module size and improve the cooling efficiency.

However, in the case of a power module, tens of A or hundreds of A of electric currents flow per semiconductor element, thereby generating substantial heat. As a result, a wiring material and a spacer on an insulating substrate connected to semiconductor elements thermally expand. However, there is a difference in thermal expansion rate between the two, and fatigue accumulates due to thermal expansion when switching operations are repeated. The accumulated fatigue may destroy the area of connection between semiconductor elements and electrodes.

The above descriptions regarding background arts have been made only to help understanding of the background of the disclosure, correspond to technical information which has been held by inventors to derive embodiments of the disclosure, or which has been acquired in the process of deriving the same, and are not to be deemed by those skilled in the art or general public to correspond to already-known prior arts prior to application.

SUMMARY

The disclosure has been proposed to solve the above-mentioned problems, and it is an aspect of the disclosure to provide a semiconductor device including an additional material having a thermal expansion efficient similar to that of a material connected to a semiconductor element in order to reduce thermal stress concentered in the semiconductor element due to a spacer bonding structure for securing a height during wire bonding with an electrode, thereby ensuring that the semiconductor element can stably operate even at high temperatures.

The above-mentioned technical aspects are not limiting in any manner, and other technical aspects may be derived from the following description.

A semiconductor device according to the disclosure includes a first circuit board and a second circuit board, a semiconductor element bonded to a control electrode of the first circuit board, a first spacer disposed between the first circuit board and the semiconductor element, bonded to the first circuit board, and bonded to the semiconductor element, and a second spacer disposed between the second circuit board and the semiconductor element, bonded to the second circuit board, and bonded to the semiconductor element.

An absolute value of a difference between a thickness of the first spacer in a direction perpendicular to a plane connected to the semiconductor element and a thickness of the second spacer in a direction perpendicular to a plane connected to a lower electrode may be less than or equal to a first reference value.

An absolute value of a difference between an electrical conductivity of the first spacer in a direction perpendicular to a plane connected to the semiconductor element and an electrical conductivity of the second spacer in a direction perpendicular to a plane connected to a lower electrode may be less than or equal to a second reference value.

An absolute value of a difference between a coefficient of thermal expansion of the first spacer in a direction perpendicular to a plane connected to the semiconductor element and a coefficient of thermal expansion of the second spacer in a direction perpendicular to a plane connected to a lower electrode may be less than or equal to a third reference value.

The semiconductor element may include a pad formed on the semiconductor element, and a metal wire configured to connect the pad and the control electrode of the first circuit board.

The semiconductor element may include a pad formed on the semiconductor element, and a metal pattern configured to connect the pad and the control electrode of the first circuit board.

The upper circuit board may further include a bonding part bonded to the first spacer on an upper insulation sheet, and the bonding part may be bonded to the first spacer through one of brazing joint or solder joint in which a sintered material is formed.

The upper circuit board may further include a large power-supply unit configured to supply power to the semiconductor element, and a third spacer located between the upper circuit board and the lower circuit board, connected to be electrically bonded to a circuit board of the upper circuit board, and bonded to the lower circuit board.

In the lower circuit board, a positive electrode terminal connected to a positive electrode of a battery, a negative electrode terminal connected to a negative electrode of the battery, and an output terminal configured to output power supplied through the semiconductor element may be formed.

A double-side cooling-type semiconductor device according to the disclosure includes a lower circuit board including an insulation sheet and a circuit board connected to both surfaces of the insulation sheet, and connected to a first heat radiator at a lower part, an upper circuit board including an insulation sheet and a circuit board connected to both sides of the insulation sheet, and connected to a second heat radiator at an upper part, a semiconductor element connected to a control electrode of the upper circuit board, a first spacer located between the upper circuit board and the semiconductor element, bonded to the upper circuit board, and connected to the semiconductor element, and a second spacer located between the lower circuit board and the semiconductor element, bonded to the lower circuit board, and connected to the semiconductor element.

An absolute value of a difference between a thickness of the first spacer in a direction perpendicular to a plane connected to the semiconductor element and a thickness of the second spacer in a direction perpendicular to a plane connected to a lower electrode may be less than or equal to a first reference value.

An absolute value of a difference between an electrical conductivity of the first spacer in a direction perpendicular to a plane connected to the semiconductor element and an electrical conductivity of the second spacer in a direction perpendicular to a plane connected to a lower electrode may be less than or equal to a second reference value.

An absolute value of a difference between a coefficient of thermal expansion of the first spacer in a direction perpendicular to a plane connected to the semiconductor element and a coefficient of thermal expansion of the second spacer in a direction perpendicular to a plane connected to a lower electrode may be less than or equal to a third reference value.

The semiconductor element may include a pad formed on the semiconductor element, and a metal wire configured to connect the pad and the control electrode of the first circuit board.

The semiconductor element may include, a pad formed on the semiconductor element, and a metal pattern configured to connect the pad and the control electrode of the first circuit board.

A semiconductor device according to the disclosure is advantageous in that the same includes an additional material having a thermal expansion efficient similar to that of a material connected to a semiconductor element in order to reduce thermal stress concentered in the semiconductor element due to a spacer bonding structure for securing a height during wire bonding with an electrode, thereby ensuring that the semiconductor element can stably operate even at high temperatures.

The above-mentioned technical advantageous effects are not limiting in any manner, and other technical advantageous effects may be derived from the following description.

DETAILED DESCRIPTION

Figure 1:
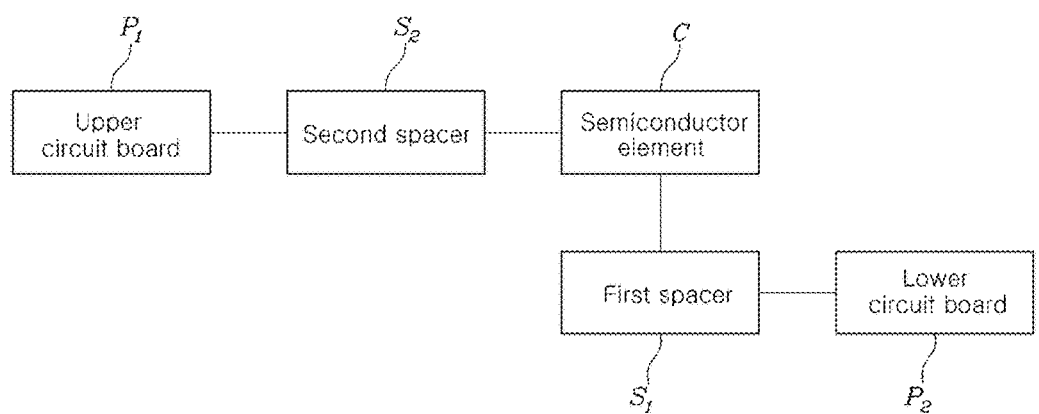
FIG. 1 is a diagram illustrating a semiconductor device according to an embodiment of the disclosure.

The specific structural and functional descriptions for the embodiments of the disclosure disclosed in the specification or the application merely pertain to examples for explaining the embodiments according to the disclosure, and embodiments of the disclosure may be implemented in various forms and should not be understood to be limited to the embodiments disclosed in the specification or the application.

In embodiments of the disclosure, the terms such as "first" and "second" are used not for limiting the scope thereof but for distinguishing one constituent from another constituent. In addition, it is to be understood that the singular forms include plural forms unless the context clearly dictates otherwise. Furthermore, the terms such as "include", "comprise", or "have" indicate the presence of characteristics or constituents described in the specification and do not exclude the possibility of adding other characteristics or constituents. In the drawings, for convenience of description, the size, thickness, etc. of the constituents may be exaggerated or reduced.

Here, the term "connected" may be used interchangeably with the term "joint" or "bond". For example, "a first spacer bonded to a first circuit board" may be expressed as "a first spacer connected to a first circuit board". That is, whether connected in a physical/electrical/other known manner or directly/indirectly, the term "connected" may be used interchangeably with the term "joint" or "bond".

Hereinafter, embodiments of the disclosure will be described in detail with reference to accompanying drawings.

Figure 2:
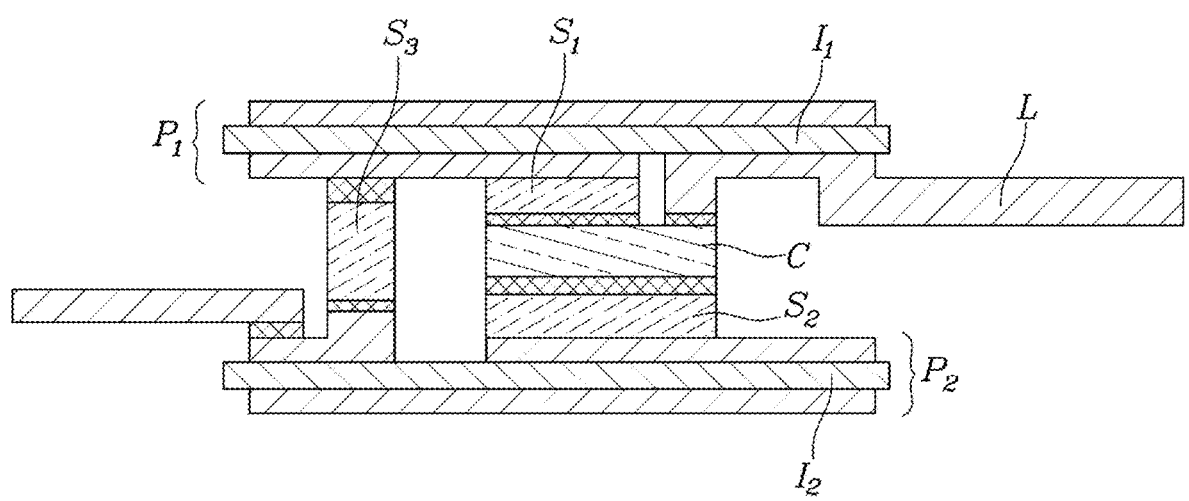
FIGS. 2 and 3 are drawings illustrating a structure of a semiconductor device according to an embodiment of the disclosure.
Figure 3:
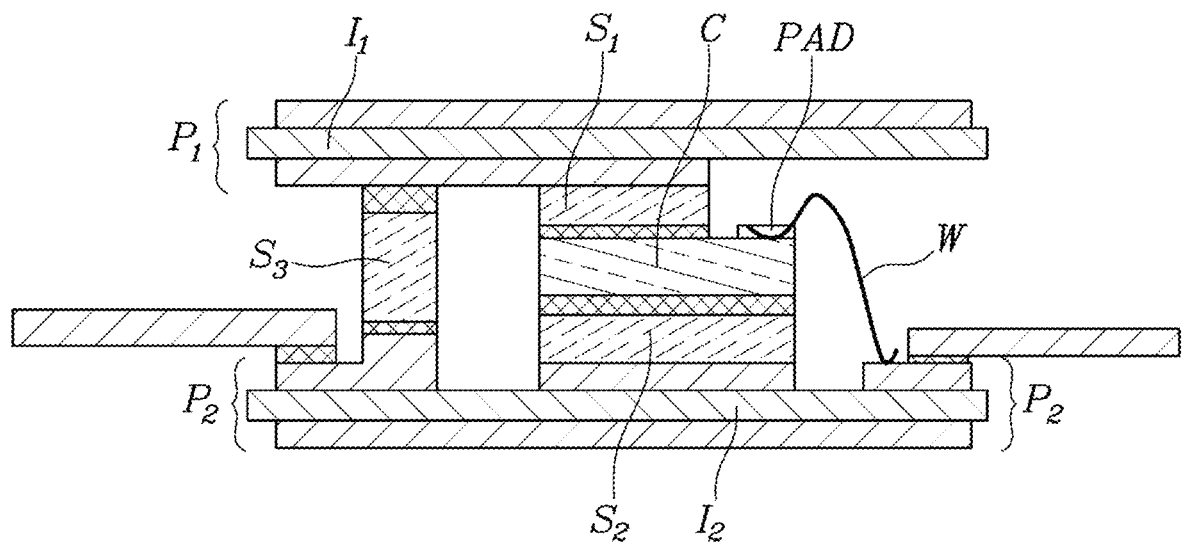

FIG. 1 is a diagram illustrating a semiconductor device according to an embodiment of the disclosure, FIGS. 2 and 3 are drawings illustrating a structure of a semiconductor device according to an embodiment of the disclosure.

FIG. 1 is a diagram illustrating a semiconductor device according to an embodiment of the disclosure, and a double-side cooling-type semiconductor device according to an embodiment of the disclosure includes a first circuit board P1 and a second circuit board P2, a semiconductor element C bonded to a control electrode of the first circuit board P1, a first spacer S1 disposed between the first circuit board and the semiconductor element, bonded to the first circuit board, and bonded to the semiconductor element, and a second spacer S2 disposed between the second circuit board and the semiconductor element, bonded to the second circuit board, and bonded to the semiconductor element. Hereinafter, for the description, the first circuit board will be referred to as an upper circuit board on the premise that the first circuit board is located at the upper part of the drawing in relation to the semiconductor element and the second circuit board will be referred to as a lower circuit board on the premise that the second circuit board is located at the lower part of the drawing in relation to the semiconductor element. However, the locations are not limited thereto. In addition, the first circuit board and the second circuit board are referred to as circuit boards including an insulation sheet and a circuit board connected to both sides of the insulation sheet for explaining illustrated drawings, but are not limited to the combination.

FIG. 1 is a diagram illustrating a semiconductor device according to an embodiment of the disclosure. The first circuit board P1 and the second circuit board P2, which are circuit boards, are metallic circuit boards and an insulation sheet may be included. An electronic circuit may be formed on a metal layer and an electronic component may be mounted on the electronic circuit. The insulation sheet may include ceramics. The metal layer may be patterned to be conductive and an active metal brazed (AMB), a direct bond copper (DBC), and the like may be included therein.

Here, the semiconductor device is a double-side cooling-type and includes multiple semiconductor elements C disposed between the upper circuit board P1 and the lower circuit board P2. An operation of switching of a power module as a semiconductor device for switching power may cause heat to be generated on the semiconductor element C. The double-side cooling-type semiconductor device may be understood as a power module having a structure configured to cool such heating with a cooler installed outside the two boards.

As shown in FIG. 1, the first spacer S1 coupled to the upper circuit board and the second spacer S2 coupled to the lower circuit board are bonded to both sides of the semiconductor element C, respectively. Specifically, in a vertical structure of vertical connection, the semiconductor element C may radiate heat as a heating element and cause thermal expansion of materials connected to the both sides the semiconductor element.

However, even in a case of such heat expansion, the double-side cooling-type semiconductor device according to an embodiment of the disclosure prevents thermal stress caused by thermal expansion from being concentrated on the semiconductor element side by configuring a form in which structures of the first spacer S1 and the second spacer S2 are identically disposed on the upper and lower parts of the semiconductor element C. Accordingly, the double-side cooling-type power module according to an embodiment of the disclosure may secure additional durability.

FIG. 2 is a drawing illustrating a structure of a semiconductor device according to an embodiment of the disclosure, and a double-side cooling-type semiconductor device according to an embodiment of the disclosure includes a lower circuit board P2 which includes an insulation board 12, a circuit pattern disposed on an upper surface of the insulation board 12 and a metal layer disposed on a lower surface of the insulation board 12, and is connected to a first heat radiator at a lower part, and an upper circuit board P1 which includes an insulation board I1, a circuit pattern disposed on a lower surface of the insulation board I1 and a metal layer disposed on an upper surface of the insulation board I1, and is connected to a second heat radiator at an upper part. Here, the metal layers of each circuit board allow rapid heat transfer to the corresponding heat radiator. The semiconductor device further includes a semiconductor element C connected to a control electrode of the upper circuit board, a first spacer S1 located between the upper circuit board and the semiconductor element, bonded to the upper circuit board, and connected to the semiconductor element, and a second spacer S2 located between the lower circuit board and the semiconductor element, bonded to the lower circuit board, and connected to the semiconductor element.

As shown in FIG. 2, the double-side cooling-type semiconductor device according to an embodiment of the disclosure refers to as a double-side cooling-type semiconductor device in which the semiconductor element C is coupled to dual spacers, the first spacer S1 at the upper part and the second spacer S2 at the lower part. That is, in the double-side cooling-type semiconductor device according to an embodiment of the disclosure, a single spacer is bisected to be coupled to the upper and lower parts of the semiconductor element C so that the first spacer S1 is connected to be electrically linked to the first circuit board and the second spacer S2 is connected to be electrically linked to the second circuit board. Therefore, heat generated by the semiconductor element may be bisected and conducted. Accordingly, heat stress concentration is dispersed, and fatigue of a semiconductor element which may be caused by heat stress or a failure of a semiconductor element which may be caused by accumulation of fatigue may be prevented.

As shown in FIG. 2, in the double-side cooling-type semiconductor device, the upper circuit board P1 may further include a large power-supply unit L configured to supply power to the semiconductor element C and a third spacer S3 located between the upper circuit board P1 and the lower circuit board P2, connected and electrically bonded to a circuit board of the upper circuit board P1, and bonded to the lower circuit board P2.

Unlike what is shown in FIG. 2, the semiconductor element C in the double-side cooling-type semiconductor device according to an embodiment of the disclosure may further include a pad PAD formed on the semiconductor element C and a metal wire W configured to connect the pad and the control electrode of the second circuit board, as shown in FIG. 3. In other words, the double-side cooling-type semiconductor device according to an embodiment of the disclosure implements the wire bonding method not at a single spacer and a semiconductor element coupled to the single spacer like the conventional technology but at the semiconductor element C coupled onto the first spacer S1 and the second spacer S2. Through this, stress concentration on the bonding part of the semiconductor element is reduced, which may be caused by a wire bonding bonded to a first circuit board and a second circuit board having a long interval therebetween. Therefore, durability of the semiconductor element is improved.

Here, the wire bonding is exemplified, and the method for connecting the bonded pad and the wire includes conventional wire bonding methods such as thermocompression bonding, ultrasonic method, and thermosonic method. A person skilled in the art may modify and apply conventional methods for coupling a semiconductor chip and a substrate, such as soldering, flip chip bonding, and through silicon via (TSV) in addition to the wire bonding.

In the double-side cooling-type semiconductor device, the upper circuit board may further include a bonding part bonded to the first spacer on the upper insulation board I1, and the bonding part may be bonded to the first spacer through one of brazing joint or solder joint in which a sintered material is formed. Here, the brazing joint is a method for joining main materials by melting only a filler material at a temperature higher than that of a welding method, and the solder joint is a method for joining main materials by melting only a filler material at a temperature lower than that of the brazing joint. These methods may prevent thermal deformation such as distortion or bulging that may occur in the welding method and particularly prevent concentration of heat or strengthen the bonding strength by differently selecting the bonding force. The bonding between the bonding part and the spacer in the double-side cooling-type semiconductor device according to an embodiment of the disclosure may be selected based on of high and low temperature environments, a strength of bonding, and ease of process.

Furthermore, as shown in FIG. 2, the semiconductor element C may include a pad formed on the semiconductor element C and a metal pattern configured to connect the pad and the control electrode of the first circuit board. That is, it is possible to apply semi-dried film-type silver sintering bonding in addition to existing solder joint or a liquid form bonding method applied to the wire bonding method. Accordingly, the double-side cooling-type semiconductor device according to an embodiment of the disclosure may remove the wire bonding by implementing a fine metal pattern as a form of attaching an additional structure, rather than a wire bonding method. As a result, an area such as the bonding part of the semiconductor element, which is considered to be internally vulnerable, is removed to improve durability of the semiconductor element.

Specifically, as shown in FIG. 2, in the double-side cooling-type semiconductor device, an absolute value of a difference between a thickness of the first spacer S1 in a direction perpendicular to a plane connected to the semiconductor element C and a thickness of the second spacer S2 in a direction perpendicular to a plane connected to a lower electrode may be less than or equal to a first reference value. That is, the double-side cooling-type semiconductor device according to an embodiment of the disclosure may be designed to cause no big change in the overall thickness by dividing a thickness of a conventional single spacer to be applied to the first spacer S1 and the second spacer S2. As a result, it is possible to compensate for problems in terms of efficiency reduction, power loss increase, and other cost aspects that may be caused by applying the second spacer, compared to the conventional technology.

In another embodiment, an absolute value of a difference between an electrical conductivity of the first spacer S1 in a direction perpendicular to a plane connected to the semiconductor element C and an electrical conductivity of the second spacer S2 in a direction perpendicular to a plane connected to the lower electrode may be less than or equal to a second reference value. In another embodiment, an absolute value of a difference between a coefficient of thermal expansion of the first spacer S1 in a direction perpendicular to a plane connected to the semiconductor element C and a coefficient of thermal expansion of the second spacer S2 in a direction perpendicular to a plane connected to the lower electrode may be less than or equal to a third reference value. In other words, the double-side cooling-type semiconductor device according to an embodiment of the disclosure may be selected as the bisected first spacer S1 and second spacer S2 configured to implement similar or identical thickness, electrical conductivity, and/or thermal expansion coefficient to those of a conventional single spacer.

This may be implemented through selection of materials. Specifically, when the first spacer is copper molybdenum (CuMo), the second spacer may be selected from among Cu/Mo/Cu (CMC), CQC, CuW, Invar (Fe—Ni alloy), Kovar (nickel-cobalt ferrous alloy) which have a similar coefficient of thermal expansion (CTE), or a combination thereof.

Alternatively, this may be implemented by mixing with materials having a negative coefficient of thermal expansion. This may be implemented by adjusting ratio of respective materials. This may be implemented by changing composition manner or composite array of respective materials.

Although the coefficient of thermal expansion, electrical conductivity, and thickness are described based on of one-dimension of a line, these may be converted based on of two-dimension of a surface and three-dimension of a volume.

Figure 4:
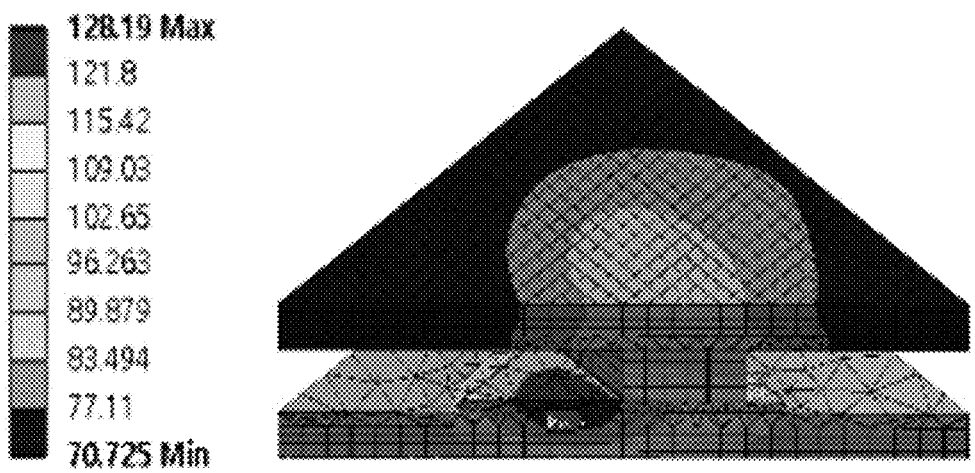
FIG. 4 is a drawing illustrating a simulation result of structural analysis of heat distribution during heat generation of a conventional semiconductor device.
Figure 5:
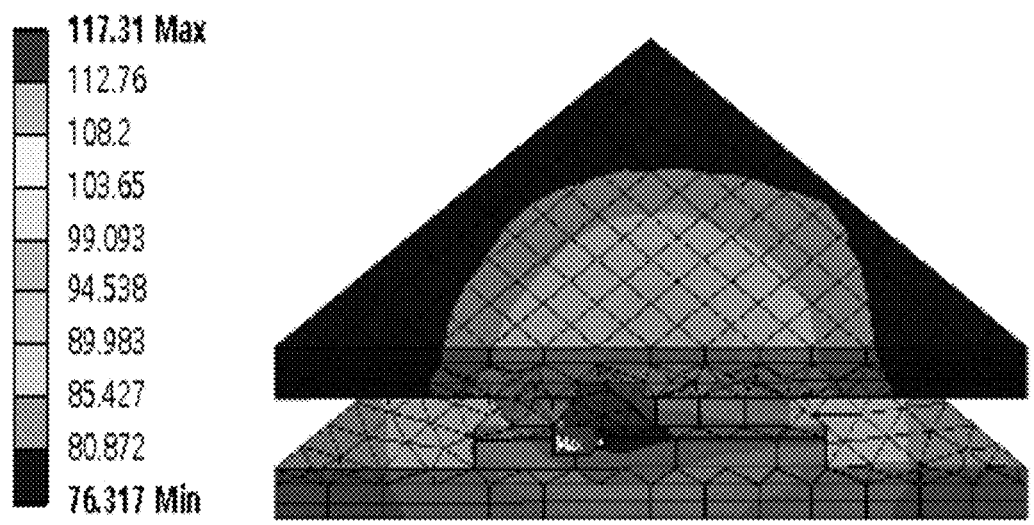
FIG. 5 is a drawing illustrating a simulation result of structural analysis of heat distribution during heat generation of a semiconductor device according to an embodiment of the disclosure.
Figure 6:
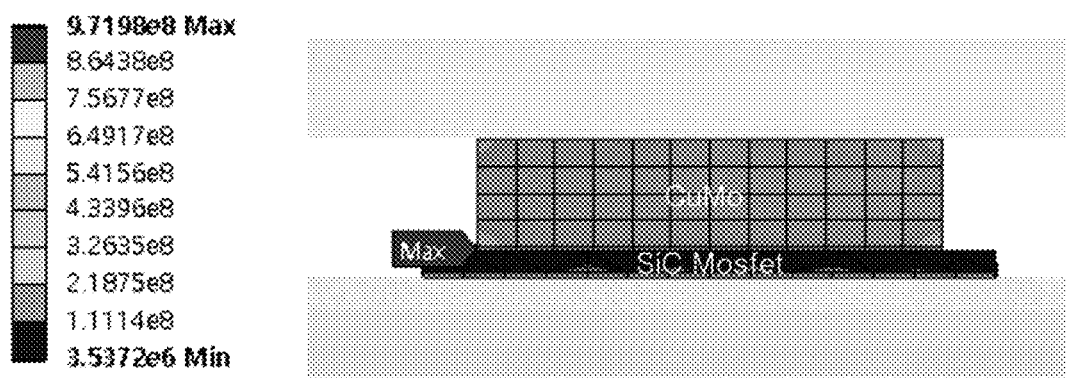
FIG. 6 is a drawing illustrating a simulation result of structural analysis of heat stress distribution during heat generation of a conventional semiconductor device.
Figure 7:
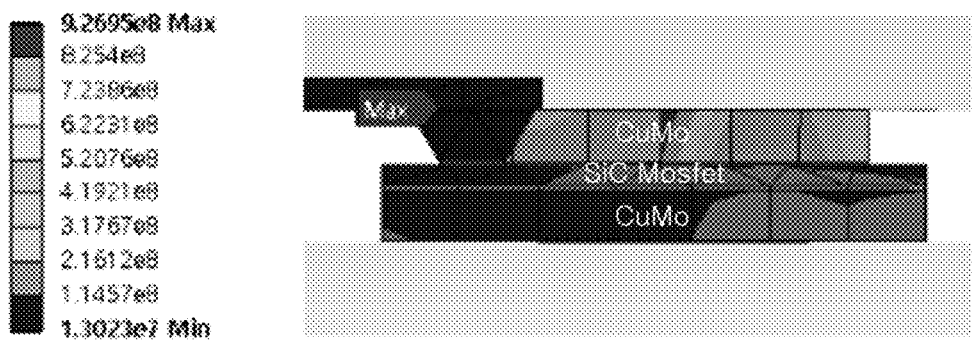
FIG. 7 is a drawing illustrating a simulation result of structural analysis of heat stress distribution during heat generation of a semiconductor device according to an embodiment of the disclosure.
Figure 8:
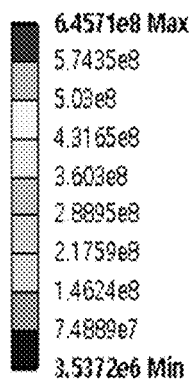
FIG. 8 is a drawing illustrating a simulation result of structural analysis of a heat stress average value during heat generation of a conventional semiconductor device.
Figure 9:
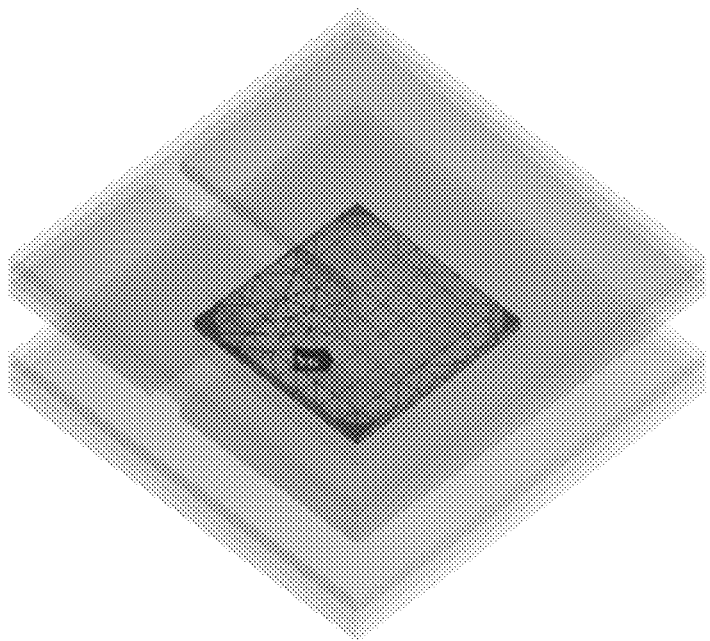
FIG. 9 is a drawing illustrating a simulation result of structural analysis of a heat stress average value during heat generation of a semiconductor device according to an embodiment of the disclosure.

FIG. 4 is a drawing illustrating a simulation result of structural analysis of heat distribution during heat generation of a conventional semiconductor device, FIG. 5 is a drawing illustrating a simulation result of structural analysis of heat distribution during heat generation of a semiconductor device according to an embodiment of the disclosure, FIG. 6 is a drawing illustrating a simulation result of structural analysis of heat stress distribution during heat generation of a conventional semiconductor device, FIG. 7 is a drawing illustrating a simulation result of structural analysis of heat stress distribution during heat generation of a semiconductor device according to an embodiment of the disclosure, FIG. 8 is a drawing illustrating a simulation result of structural analysis of a heat stress average value during heat generation of a conventional semiconductor device, and FIG. 9 is a drawing illustrating a simulation result of structural analysis of a heat stress average value during heat generation of a semiconductor device according to an embodiment of the disclosure.

FIG. 4 is a drawing illustrating a simulation result of structural analysis of heat distribution during heat generation of a semiconductor device of a previous disclosure. Here, the double-side cooling power module simulated as a conventional technology has the same structure as the power module in FIG. 2. The 3D simulation is performed using Ansys Workbench 18.2 software. The software performs static structural analysis of the heat distribution according to space. The simulation result was obtained by operating the same size SiC element under the same conditions and comparing. An operation of the semiconductor element cooled by cooling water of 65 degrees C. on the upper circuit board and the lower circuit board was assumed.

As shown in FIG. 4, it was confirmed that heat was concentrated around the bonding part of the semiconductor element and the concentrated heat was not transferred to other spaces.

FIG. 5 is a drawing illustrating a simulation result of structural analysis of heat distribution during heat generation of a semiconductor device according to an embodiment of the disclosure. As shown in FIG. 5, it was confirmed that the heat was not concentrated on the bonding part of the semiconductor element but dispersed to the first spacer S1 side of the upper part.

FIG. 6 is a drawing illustrating a simulation result of structural analysis of heat stress distribution during heat generation of a semiconductor device of a previous disclosure. As shown in FIG. 6, similar to the case of the heat distribution, it was confirmed that the heat stress (unit of Pa) according to heat generation in the conventional semiconductor device was concentrated on a portion corresponding to the first spacer S1 and the bonding surface of the semiconductor element.

FIG. 7 is a drawing illustrating a simulation result of structural analysis of heat stress distribution during heat generation of a semiconductor device according to an embodiment of the disclosure. As shown in FIG. 7, similar to the case of the heat distribution, it was confirmed that the heat stress (unit of Pa) according to heat generation in the semiconductor device of the double-side cooling semiconductor device according to an embodiment of the disclosure was not concentrated on the portion corresponding to the first spacer S1 and the bonding surface of the semiconductor element but dispersed to the first spacer S1 of the upper part so that the maximum stress point is changed.

FIG. 8 is a drawing illustrating a simulation result of structural analysis of a heat stress average value during heat generation of a semiconductor device of a previous disclosure. As shown in FIG. 8, the average value of the heat stress was $6.4571 \times 10^8$ Pa, and it was confirmed that the transfer of heat generated by the semiconductor element was not performed properly.

FIG. 9 is a drawing illustrating a simulation result of structural analysis of a heat stress average value during heat generation of a semiconductor device according to an embodiment of the disclosure. As shown in FIG. 9, the average value of the heat stress was $4.6508 \times 10^8$ Pa, and it was confirmed that the transfer of heat generated by the semiconductor element was performed in the first spacer direction, thus decreasing the overall heat stress.

The double-side cooling semiconductor device according to an embodiment of the disclosure is provided to solve the thermal expansion of the semiconductor element accompanying with huge heat generation. A wire material on the insulation board and the spacer connected to the semiconductor element are thermally expanded. However, the wire material and the spacer have different the thermal expansion rates or the like. Here, when the switching operations of the semiconductor element are repeated, fatigue caused by the thermal expansion may be accumulated. The part in which the semiconductor element and the electrode are connected to each other may be destroyed due to the accumulated fatigue. Specifically, in the conventional technology, the heat stress is concentrated on the semiconductor element due to a spacer bonding structure for securing a height when wire-bonding the electrode. In order to solve the aforementioned problems, the double-side cooling semiconductor device according to an embodiment of the disclosure additionally disposes a material having a similar coefficient of thermal expansion to a material connected to the semiconductor element on the lower side of the semiconductor element. Through this, the double-side cooling semiconductor device according to an embodiment of the disclosure allows the semiconductor element to operate stably at a high temperature.

Here, the semiconductor element is configured to on or off the power required for the driving of a motor and may be at least one of a BJT, a silicon controlled rectifier (SCR), a TRIAC, an unijunction transistor (UJT), a programmable unijunction transistor (PUT), a junction field effect transistor (JFET), a gate turn off thyristor (GTO), a MOS controlled thyristor (MCT), an injection-enhanced gate transistor (IEGT), an integrated gate bipolar transistor (IGBT), an integrated gate commutated thyristor (IGCT), a MOSFET, Intelligent Power Device (IPD, a semiconductor switch), and a diode element.

Although certain embodiments have been illustrated and described above, it would be obvious to a person skilled in the art that various changes and modifications can be made without departing from the spirit of the claims. Therefore, the technical protection scope of the disclosure should be defined by the technical spirit of the appended claims.

The invention claimed is:

1. A double-side cooling-type semiconductor device comprising:
   a first circuit board and a second circuit board;
   a semiconductor element bonded to a control electrode of the first circuit board;
   a first spacer disposed between the first circuit board and the semiconductor element, wherein the first spacer is bonded to the first circuit board, and bonded to the semiconductor element; and
   a second spacer disposed between the second circuit board and the semiconductor element, wherein the second spacer is bonded to the second circuit board, and bonded to the semiconductor element;
   wherein the first circuit board further comprises a bonding part bonded to the first spacer on an upper insulation sheet; and
   wherein the bonding part and the first spacer are formed of different materials.

2. The double-side cooling-type semiconductor device of claim 1, wherein an absolute value of a difference between a thickness of the first spacer in a direction perpendicular to a plane connected to the semiconductor element, and a thickness of the second spacer in a direction perpendicular to a plane connected to a lower electrode is less than or equal to a first reference value.

3. The double-side cooling-type semiconductor device of claim 1, wherein an absolute value of a difference between an electrical conductivity of the first spacer in a direction perpendicular to a plane connected to the semiconductor element, and an electrical conductivity of the second spacer in a direction perpendicular to a plane connected to a lower electrode is less than or equal to a second reference value.

4. The double-side cooling-type semiconductor device of claim 1, wherein an absolute value of a difference between a coefficient of thermal expansion of the first spacer in a direction perpendicular to a plane connected to the semiconductor element, and a coefficient of thermal expansion of the second spacer in a direction perpendicular to a plane connected to a lower electrode is less than or equal to a third reference value.

5. The double-side cooling-type semiconductor device of claim 1, wherein the semiconductor element comprises:
   a pad formed on the semiconductor element; and
   a metal wire configured to connect the pad and the control electrode of the first circuit board.

6. The double-side cooling-type semiconductor device of claim 1, wherein the semiconductor element comprises:
   a pad formed on the semiconductor element; and
   a metal pattern configured to connect the pad and the control electrode of the first circuit board.

7. The double-side cooling-type semiconductor device of claim 1, wherein the bonding part is bonded to the first spacer through one of brazing joint or solder joint in which a sintered material is formed.

8. The double-side cooling-type semiconductor device of claim 1, wherein the upper circuit board further comprises a large power-supply unit configured to supply power to the semiconductor element, and a third spacer located between the upper circuit board and the lower circuit board electrically bonded to a circuit board of the upper circuit board, and bonded to the lower circuit board.

9. The double-side cooling-type power module of claim 1, wherein in the lower circuit board comprises a positive electrode terminal connected to a positive electrode of a battery, a negative electrode terminal connected to a negative electrode of the battery, and an output terminal configured to output power supplied through the semiconductor element.

10. A double-side cooling-type semiconductor device comprising:
    a lower circuit board comprising a first insulation sheet, a circuit pattern disposed on a first surface of the first insulation sheet and a metal layer disposed on a second surface of the first insulation sheet, wherein a lower part of the lower circuit board is connected to a first heat radiator;

an upper circuit board comprising a second insulation sheet, a circuit pattern disposed on a first surface of the second insulation sheet and a metal layer disposed on a second surface of the second insulation sheet, wherein an upper part of the upper circuit board is connected to a second heat radiator;

a semiconductor element connected to a control electrode of the upper circuit board;

a first spacer located between the upper circuit board and the semiconductor element, wherein the first spacer is bonded to the upper circuit board and connected to the semiconductor element; and a second spacer located between the lower circuit board and the semiconductor element, wherein the second spacer is bonded to the lower circuit board and connected to the semiconductor element;

wherein the upper circuit board further comprises a bonding part bonded to the first spacer on the second insulation sheet; and wherein the bonding part and the first spacer are formed of different materials.

11. The double-side cooling-type semiconductor device of claim 10, wherein an absolute value of a difference between a thickness of the first spacer in a direction perpendicular to a plane connected to the semiconductor element and a thickness of the second spacer in a direction perpendicular to a plane connected to a lower electrode is less than or equal to a first reference value.

12. The double-side cooling-type semiconductor device of claim 10, wherein an absolute value of a difference between an electrical conductivity of the first spacer in a direction perpendicular to a plane connected to the semiconductor element and an electrical conductivity of the second spacer in a direction perpendicular to a plane connected to a lower electrode is less than or equal to a second reference value.

13. The double-side cooling-type semiconductor device of claim 10, wherein an absolute value of a difference between a coefficient of thermal expansion of the first spacer in a direction perpendicular to a plane connected to the semiconductor element and a coefficient of thermal expansion of the second spacer in a direction perpendicular to a plane connected to a lower electrode is less than or equal to a third reference value.

14. The double-side cooling-type semiconductor device of claim 10, wherein the semiconductor element comprises:
a pad formed on the semiconductor element;
and a metal wire configured to connect the pad and the control electrode of the first circuit board.

15. The double-side cooling-type semiconductor device of claim 10, wherein the semiconductor element comprises:
a pad formed on the semiconductor element;
and a metal pattern configured to connect the pad and the control electrode of the first circuit board.

* * * * *